(12) United States Patent
Sugizaki et al.

(10) Patent No.: US 8,373,192 B2
(45) Date of Patent: Feb. 12, 2013

(54) SEMICONDUCTOR LIGHT EMITTING DEVICE

(75) Inventors: Yoshiaki Sugizaki, Kanagawa-ken (JP); Hideki Shibata, Kanagawa-ken (JP); Akihiro Kojima, Kanagawa-ken (JP); Masayuki Ishikawa, Kanagawa-ken (JP); Hideo Tamura, Kanagawa-ken (JP); Tetsuro Komatsu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 12/883,745

(22) Filed: Sep. 16, 2010

(65) Prior Publication Data

US 2011/0297994 A1 Dec. 8, 2011

(30) Foreign Application Priority Data

Jun. 3, 2010 (JP) .................... 2010-127968

(51) Int. Cl.
*H01L 33/00* (2010.01)
(52) U.S. Cl. ............... 257/99; 257/79; 257/88; 257/93; 257/E33.058; 438/22; 438/26; 438/28
(58) Field of Classification Search .................... 257/79, 257/88, 93, 99, E33.058; 438/22, 26, 28
See application file for complete search history.

(56) References Cited

U.S. PATENT DOCUMENTS

2010/0148198 A1 6/2010 Sugizaki et al.

FOREIGN PATENT DOCUMENTS

JP 2009059909 3/2009

*Primary Examiner* — Kenneth Parker
*Assistant Examiner* — John Lin
(74) *Attorney, Agent, or Firm* — Turocy & Watson, LLP

(57) ABSTRACT

According to one embodiment, a semiconductor light emitting device includes a plurality of semiconductor layers, a first electrode, a second electrode, an insulating layer, a first interconnection layer, a second interconnection layer, a first metal pillar, a second metal pillar and a resin layer, and is mounted in a bent state on a curved surface. The plurality of semiconductor layers includes a first main surface, a second main surface opposite to the first main surface, and a light emitting layer, the plurality of semiconductor layers being separated from one another. A material is provided between the plurality of the semiconductor layers separated from one another. The member has a higher flexibility than the semiconductor layers being.

20 Claims, 11 Drawing Sheets

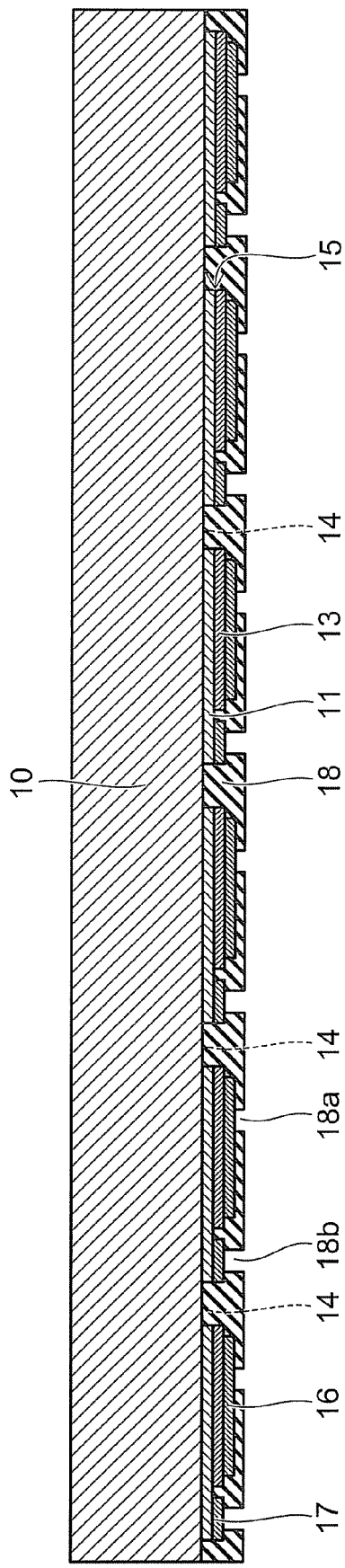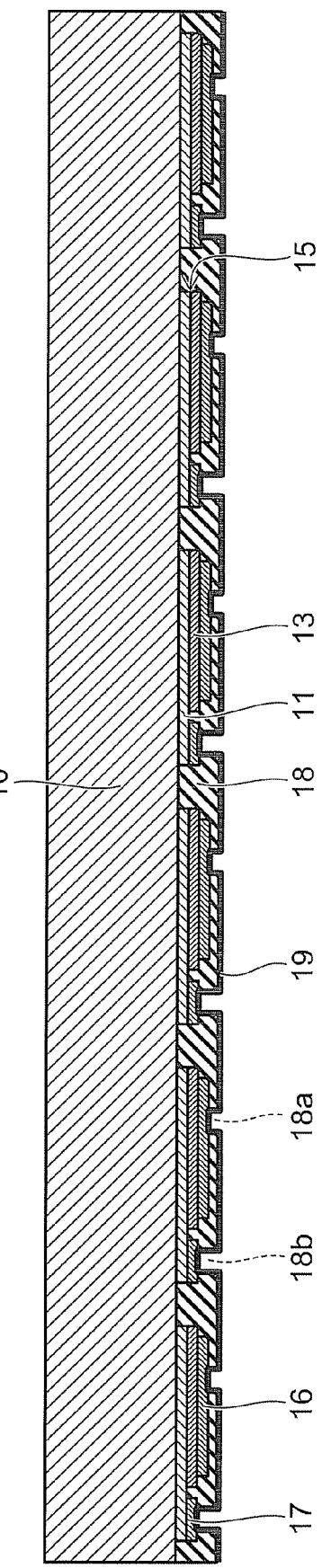

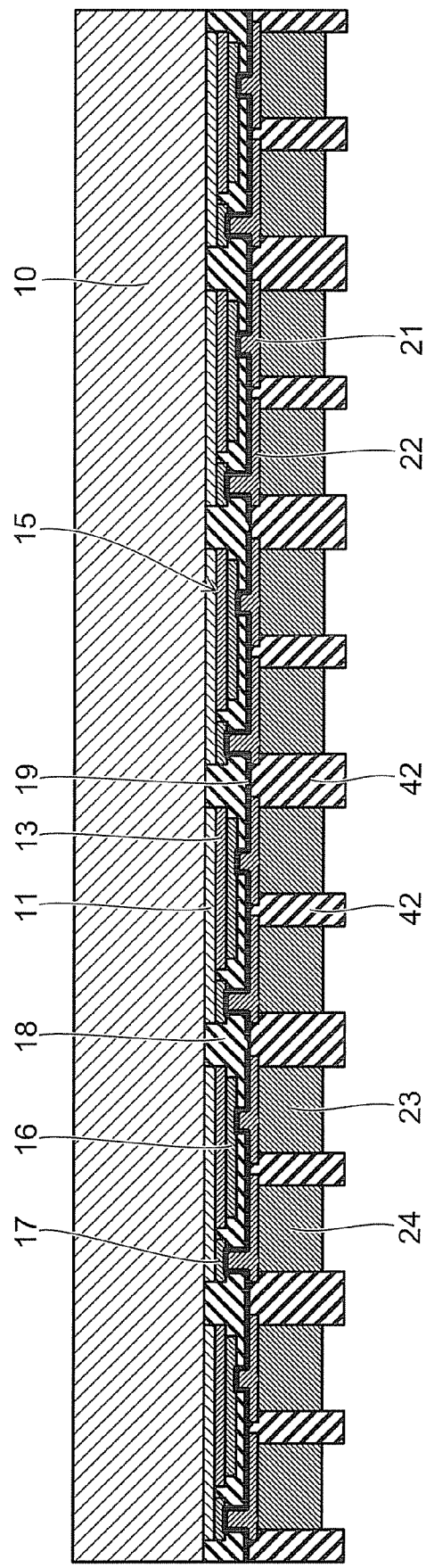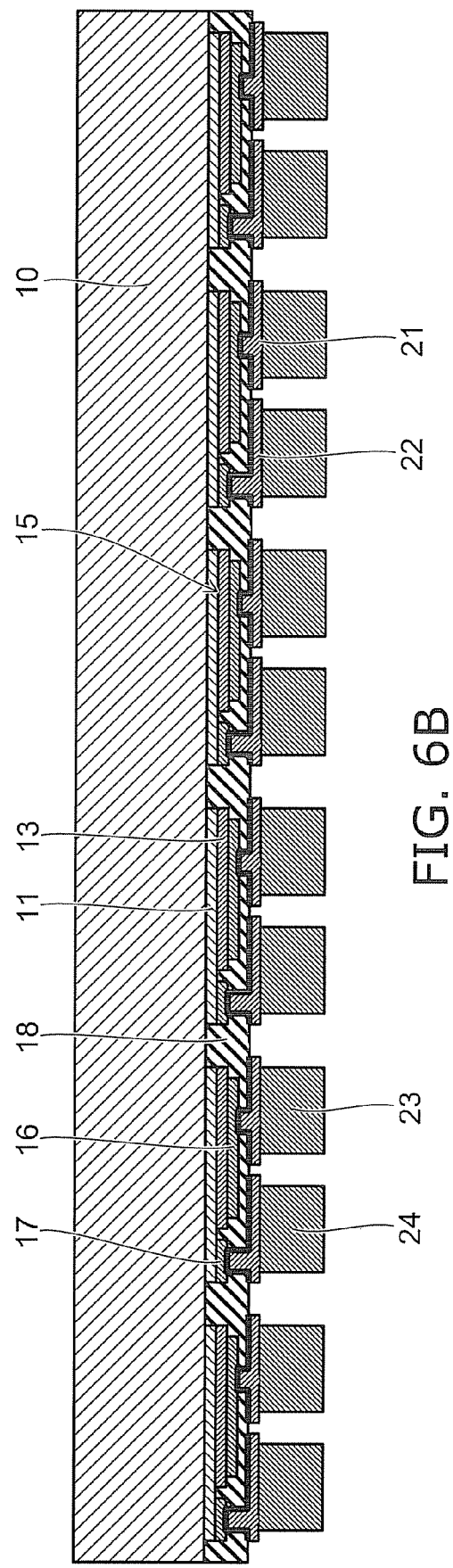
FIG. 6A
FIG. 6B

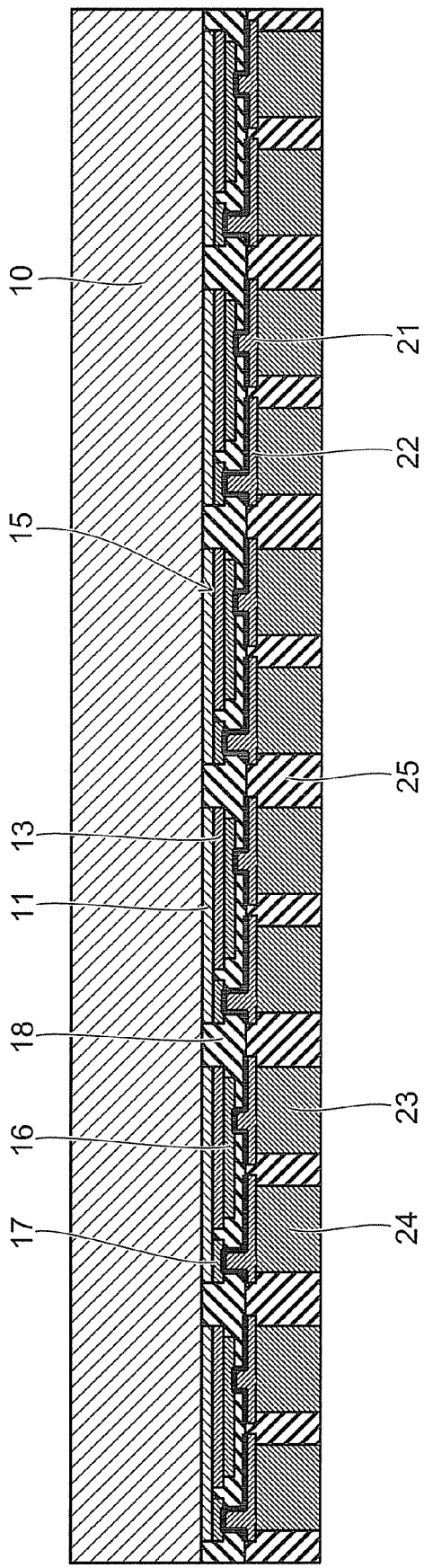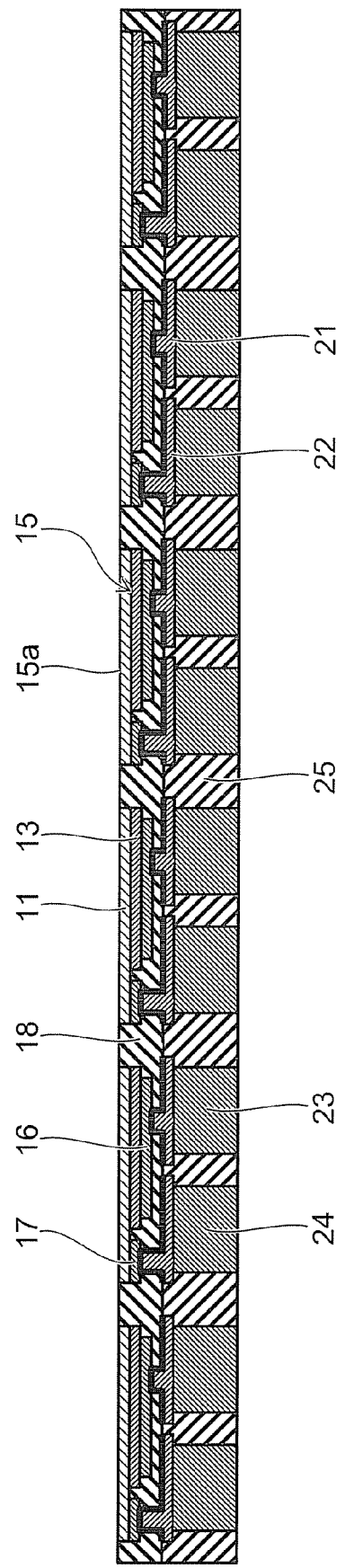
FIG. 7A
FIG. 7B

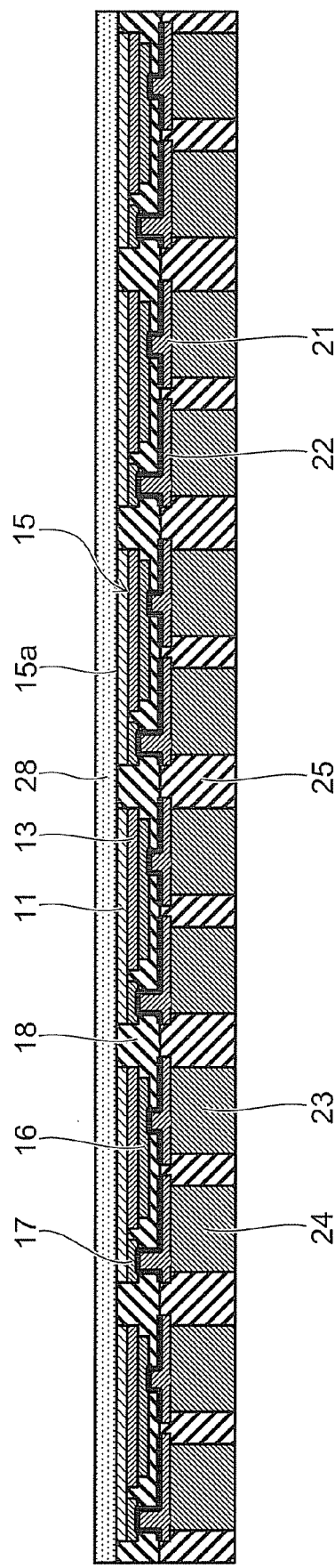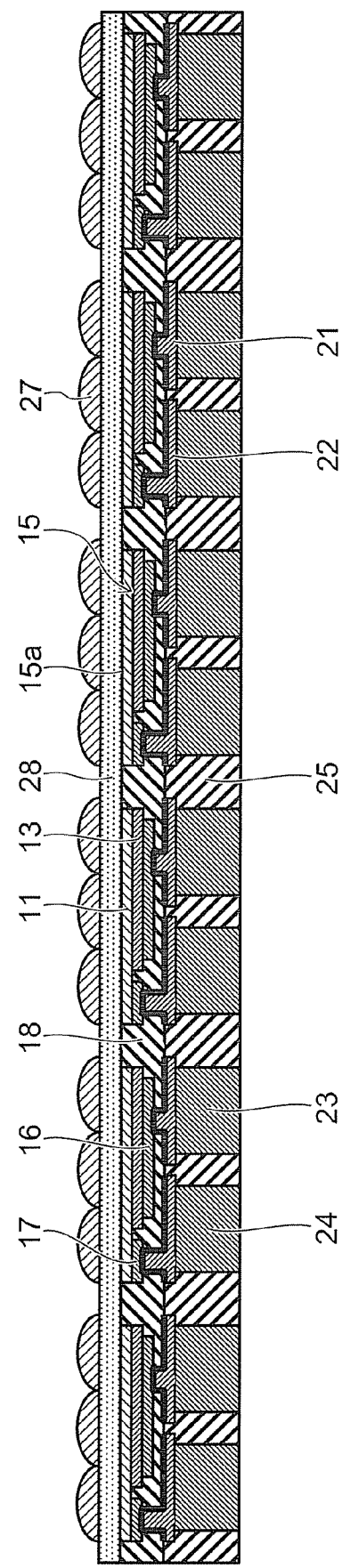

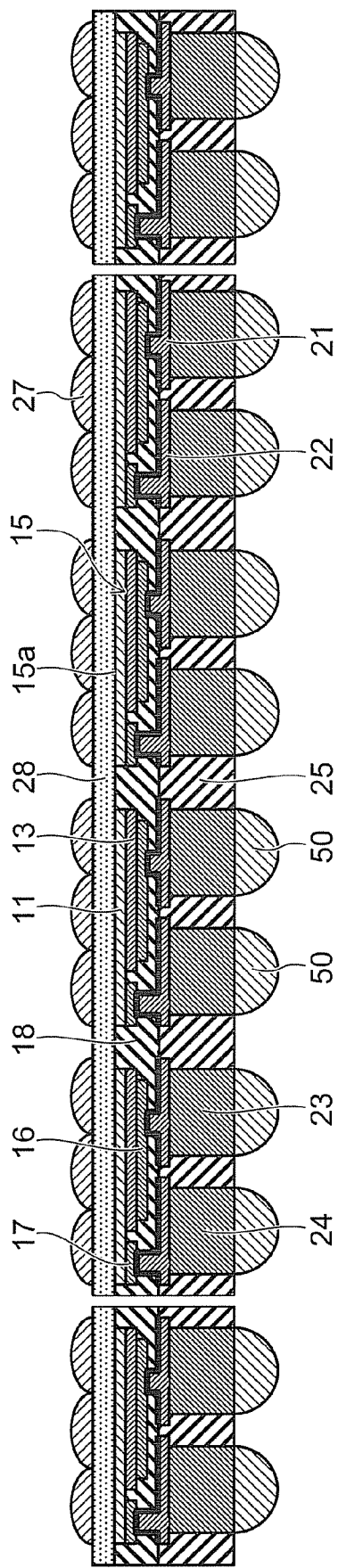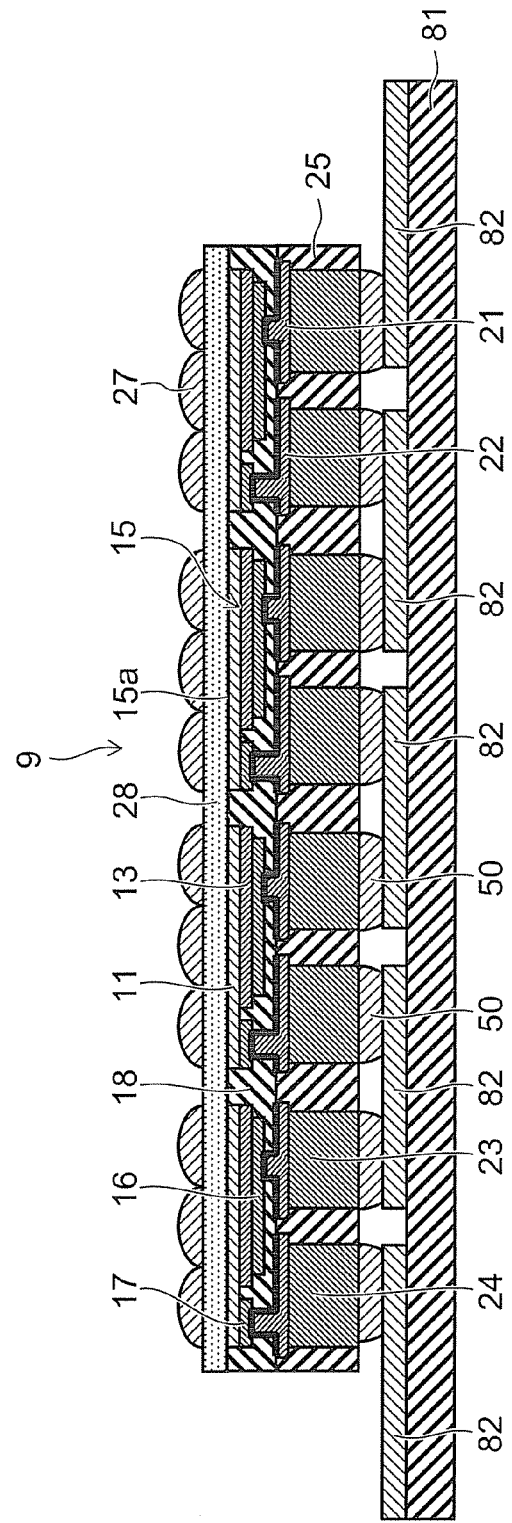

US 8,373,192 B2

SEMICONDUCTOR LIGHT EMITTING DEVICE

CROSS-REFERENCE TO RELATED APPLICATION

This application is based upon and claims the benefit of priority from Japanese Patent Application No. 2010-127968, filed on Jun. 3, 2010; the entire contents of which are incorporated herein by reference.

FIELD

Embodiments described herein relate generally to a semiconductor light emitting device.

BACKGROUND

The applications of light emitting devices capable of emitting visible light and white light have been expanding to a wide range of fields including illuminating devices, backlight sources for image display devices, and display devices. For such applications, the light emitting devices have been demanded to be capable of brightly illuminating wider areas when used as linear light sources and surface light sources. In addition, various forms of implementation of the light emitting devices have been demanded in response to the expansion of the applications.

BRIEF DESCRIPTION OF THE DRAWINGS

FIGS. 2A to 9B are schematic views showing a method for manufacturing the semiconductor light emitting device of the embodiment;

DETAILED DESCRIPTION

Figure 1:
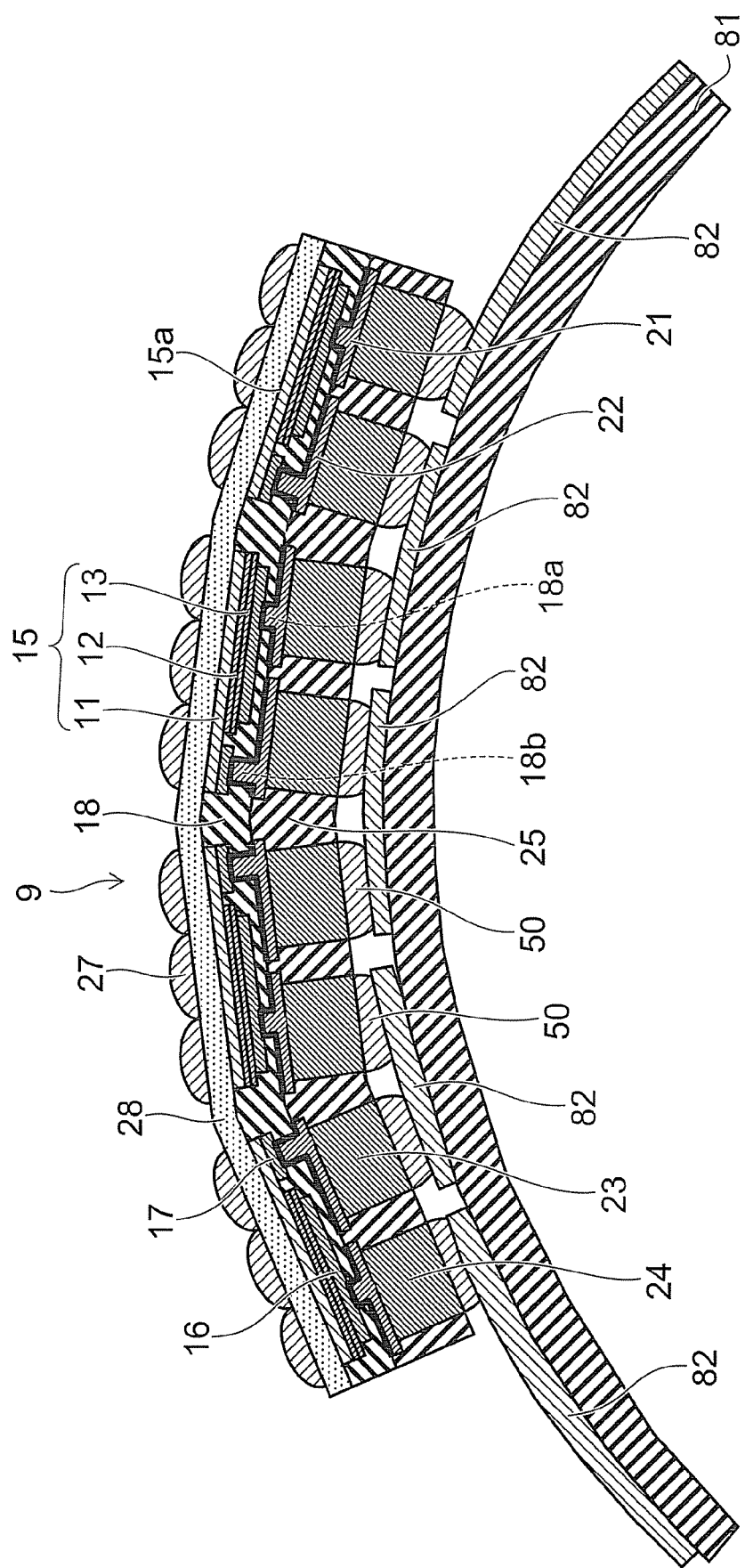
FIG. 1 is a schematic cross-sectional view of a semiconductor light emitting device of an embodiment.

According to one embodiment, a semiconductor light emitting device includes a plurality of semiconductor layers, a first electrode, a second electrode, an insulating layer, a first interconnection layer, a second interconnection layer, a first metal pillar, a second metal pillar and a resin layer, and is mounted in a bent state on a curved surface. The plurality of semiconductor layers includes a first main surface, a second main surface opposite to the first main surface, and a light emitting layer, the plurality of semiconductor layers being separated from one another. The first electrode is provided on the second main surface in a region including the light emitting layer. The second electrode is provided on the second main surface in a region not including the light emitting layer. The insulating layer is provided on the second main surface side of the semiconductor layers and having a first opening and a second opening, the first opening reaching the first electrode, the second opening reaching the second electrode. The first interconnection layer is provided on a surface of the insulating layer on an opposite side to the semiconductor layer and provided in the first opening The first interconnection layer is connected to the first electrode. The second interconnection layer is provided on the surface of the insulating layer on the opposite side to the semiconductor layer and provided in the second opening. The second interconnection layer is connected to the second electrode. The first metal pillar is provided on a surface of the first interconnection layer on an opposite side to the first electrode. The second metal pillar is provided on the surface of the second interconnection layer on the opposite side to the second electrode. The resin layer is provided between the first metal pillar and the second metal pillar. A material is provided between the plurality of the semiconductor layers separated from one another. The member has a higher flexibility than the semiconductor layers being.

Hereinafter, embodiments will be described with reference to the drawings. It should be noted that the same elements are denoted by the same reference numerals in the drawings, and the drawings illustrating processes show a partial region in a wafer.

FIG. 1 is a schematic cross-sectional view of a semiconductor light emitting device 9 of the embodiment. FIG. 1 shows a state where the semiconductor light emitting device 9 is mounted in a bent state on a curved surface.

The semiconductor light emitting device 9 is a semiconductor light emitting device having a so-called multi-chip structure, including multiple semiconductor layers 15 separated from one another. Each of the semiconductor layers 15 includes a first main surface 15a and a second main surface (lower side in FIG. 1) which is the opposite side to the first main surface 15a. Electrodes and interconnection layers are provided on the second main surface side. Light is mainly extracted from the first main surface 15a.

Each semiconductor layer 15 includes a first semiconductor layer 11 and a second semiconductor layer 13. The first semiconductor layer 11 is an n-type GaN layer, for example, and functions as a lateral current path. It should be noted that the conductivity type of the first semiconductor layer 11 is not limited to the n-type, but may be the p-type. The second semiconductor layer 13 has a stacked structure in which a light emitting layer (active layer) 12 is sandwiched by an n-type layer and a p-type layer.

The second main surface side of each semiconductor layer 15 is processed into a stepped shape, so that an upper step portion and a lower step portion are provided on the second main surface side. The upper step portion, which is located at an upper level than the lower step portion when viewed from the first main surface 15a, includes the light emitting layer 12. The lower step portion does not include the light emitting layer 12, and is provided outside the outer periphery (edge portion) of the light emitting layer 12.

A p-side electrode 16 serving as a first electrode is provided on a surface of the second semiconductor layer 13, which is a surface of the upper step portion. In other words, the p-side electrode 16 is provided in a region including the light emitting layer 12. An n-side electrode 17 serving as a second electrode is provided on a surface of the first semiconductor layer 11 in the lower step portion.

Figure 2A:
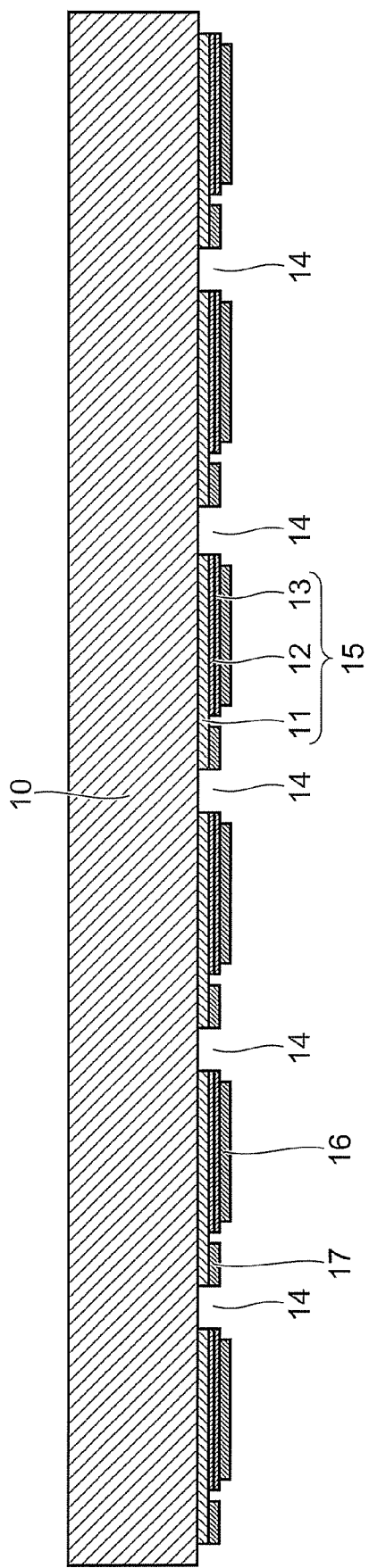
Figure 2B:
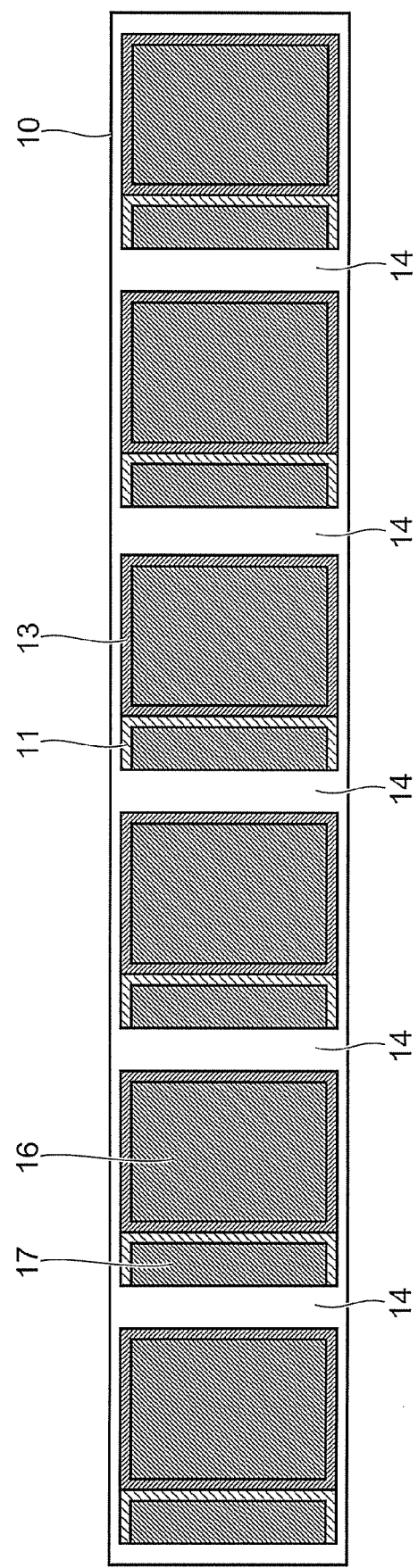

FIG. 2B shows an example of a plane layout of the p-type electrodes 16 and the n-type electrodes 17. In each single semiconductor layer 15, the area of the p-side electrode 16 is larger than the area of the n-side electrode 17. This makes it possible to obtain a wide light emitting region.

The second main surface side of the semiconductor layers 15 is covered with an insulating layer 18. The insulating layer 18 is filled also between each adjacent ones of the semiconductor layers 15, so that the edge portions (side surfaces) of each semiconductor layer 15 are covered with the insulating layer 18. The insulating layer 18 is filled also between the p-side electrode 16 and the n-side electrode 17 of each semiconductor layer 15. The insulating layer 18 is made of, for example, a resin, such as polyimide, that is excellent in patterning of fine openings. Alternatively, a silicon oxide may be used for the insulating layer 18.

A p-side interconnection layer 21 serving as a first interconnection layer and an n-side interconnection layer 22 serving as a second interconnection layer are provided on a surface of the insulating layer 18 on the opposite side to each semiconductor layer 15. The p-side interconnection layer 21 is provided also in a first opening 18a formed in the insulating layer 18 to reach the p-side electrode 16, so that the p-side interconnection layer 21 is connected to the p-side electrode 16. The n-side interconnection layer 22 is provided also in a second opening 18b formed in the insulating layer 18 to reach the n-side electrode 17, so that the n-side interconnection layer 22 is connected to the n-side electrode 17.

A p-side metal pillar 23 is provided as a first metal pillar on a surface of the p-side interconnection layer 21 on the opposite side to the corresponding p-side electrode 16. An n-side metal pillar 24 is provided as a second metal pillar on a surface of the n-side interconnection layer 22 on the opposite side to the corresponding n-side electrode 17.

The periphery of each p-side metal pillar 23, the periphery of each n-side metal pillar 24, the p-side interconnection layer 21, and the n-side interconnection layer 22 are covered with a resin layer 25. The resin layer 25 is filled between each adjacent pillars. A lower surface of each of the p-side metal pillars 23 and the n-side metal pillars 24 are exposed from the resin layer 25.

The n-side interconnection layer 22 connected to the n-side electrode 17 provided in the portion that does not include the light emitting layer 12 in each semiconductor layer 15 is formed in such a manner that the area of the surface of the n-side interconnection layer 22 on the opposite side to the n-side electrode 17 is larger than that of the surface thereof on the n-side electrode 17 side. In other words, the contact area between the n-side interconnection layer 22 and the n-side metal pillar 24 is larger than the contact area between the n-side interconnection layer 22 and the n-side electrode 17. The contact area between the p-side interconnection layer 21 and the p-side metal pillar 23 is larger than the contact area between the p-side interconnection layer 21 and the p-side electrode 16. Alternatively, in some cases, the contact area between the p-side interconnection layer 21 and the p-side metal pillar 23 is smaller than the contact area between the p-side interconnection layer 21 and the p-side electrode 16. In addition, part of the n-side interconnection layer 22 extends on the insulating layer 18 to a position under the light emitting layer 12 in an overlapping manner.

With this structure, it is possible to form a wider extraction electrode extending through the n-side interconnection layer 22 from the n-side electrode 17 provided in the narrow area of a portion, not including the light emitting layer 12, in each semiconductor layer 15 while a high light output is secured with the wider light emitting layer 12.

Each first semiconductor layer 11 is electrically connected to the n-side metal pillar 24 through the n-side electrode 17 and the n-side interconnection layer 22. Each second semiconductor layer 13 is electrically connected to the p-side metal pillar 23 through the p-side electrode 16 and the p-side interconnection layer 21.

It should be noted that, on the surface of each of the p-side metal pillars 23 and the n-side metal pillars 24 (a lower surface thereof in FIG. 1), a surface treatment film for rust prevention or another purpose is formed as needed (for example, non-eletrolytic plating films of Ni, Au, and the like; precoated solder; or volatile organic coating films called organic solderbility preservatives (OSP)).

Copper, gold, nickel, silver, or the like may be used as the material for the n-side interconnection layers 22, the p-side interconnection layers 21, the n-side metal pillars 24, and the p-side metal pillars 23. Among these materials, more preferable is copper, which has a favorable heat conductivity, a high migration resistance, and an excellent adhesion with an insulating material.

The resin layer 25 functions as reinforcing the n-side metal pillars 24 and the p-side metal pillars 23. A material having a coefficient of thermal expansion equal or close to that of a mount board 81 is desirably used for the resin layer 25. Examples of such material for the resin layer 25 include an epoxy resin, a silicone resin, a fluororesin, and the like.

A phosphor layer 28 is provided on the first main surfaces 15a of the semiconductor layers 15. Further, lenses 27 are provided on the phosphor layer 28. The phosphor layer 28 is provided as a single layer continuously extending on the first main surfaces 15a of the respective semiconductor layers 15, and on the insulating layer 18 between each adjacent semiconductor layers 15.

The phosphor layer 28 is capable of absorbing light from the light emitting layers 12 and emitting wavelength-converted light. Accordingly, it is made possible to emit a mixed light of the light from the light emitting layers 12 and the wavelength-converted light from the phosphor layer 28. For example, when the light emitting layers 12 are made of a nitride, blue light is emitted from the light emitting layers 12. Also, when the phosphor layer 28 is a yellow phosphor layer, yellow light is emitted from the phosphor layer 28 as the wavelength-converted light. As a result, light of white color or a warm white color can be obtained as the mixed color light of the blue light and the yellow light. It should be noted that the phosphor layer 28 may contain multiple different kinds of phosphors (for example, a red phosphor and a green phosphor).

The light emitted from each light emitting layer 12 is emitted to the outside through the first semiconductor layer 11, the first main surface 15a, the phosphor layer 28, and the lenses 27.

The semiconductor light emitting device 9 is mounted on the mount board 81 with external terminals 50 such as solder interposed therebetween, for example. The external terminals 50 are interposed between lower surfaces of the respective p-side and n-side metal pillars 23 and 24, and corresponding pads 82 formed on the mount board 81, respectively. The external terminals 50 connect the p-side and n-side metal pillars 23 and 24 to the corresponding pads 82, respectively.

The semiconductor light emitting device 9 is entirely curved and mounted on a curved surface of the mount board 81. For example, in the embodiment shown in FIG. 1, the light emitting surface side of the semiconductor light emitting device 9 where the phosphor layer 28 is provided, is convexly curved. This configuration makes it possible to achieve light distribution characteristics to distribute emitted light. Alternatively, the semiconductor light emitting device 9 may be bent in such a manner that the light emitting surface side thereof is concavely curved. In this case, a light collecting effect is expected to be achieved. In any case, the configuration in which the semiconductor light emitting device 9 is mounted in a bent state facilitates the controlling of the light distribution. This facilitates an optical design in a case where the semiconductor light emitting device 9 is used as a linear or surface light source.

When the mount board 81 is, for example, a flexible board, the semiconductor light emitting device 9 may be first mounted on the flexible board, and then, bent together with the flexible board. In this way, the semiconductor light emitting device 9 mounted on the curved surface can be obtained. Alternatively, the semiconductor light emitting device 9 may be mounted, while being concurrently bent, on the mount board 81 which has already been curved before the semiconductor light emitting device 9 is mounted thereon.

The multiple semiconductor layers 15 are separated from one another and are not connected to one another. Accordingly, when the entire semiconductor light emitting device 9 is bent, each of the semiconductor layers 15 does not need to be bent. Accordingly, the semiconductor layers 15 can be prevented from being broken. In the same manner, the multiple p-side electrodes 16 and n-side electrodes 17 are separated from one another, the multiple p-side interconnection layers 21 and n-side interconnection layers 22 are separated from one another, and the multiple p-side metal pillars 23 and n-side metal pillars 24 are separated from one another.

The resin layer 25 is formed entirely in the plane directions while surrounding the peripheries of the p-side metal pillars 23 and the n-side metal pillars 24. Moreover, in order to secure the mechanical strength of the semiconductor light emitting device 9, the resin layer 25 has a thickness thicker than the thickness of a stacked body including the semiconductor layers 15, the p-side electrodes 16, the n-side electrodes 17, the insulating layer 18, the p-side interconnection layers 21, and the n-side interconnection layers 22. For this reason, the bendability of the semiconductor light emitting device 9 depends on the bendability of the resin layer 25, and therefore, the resin layer 25 requires a sufficient flexibility.

For example, when the resin layer 25 has a structure containing a rubber such as polydimethylsiloxane (PDMS) as a main component, the resin layer 25 exhibits a higher flexibility than those of the semiconductor layers 15 and the insulating layer 18, in turn making it possible to easily bend the semiconductor light emitting device 9.

In addition, the insulating layer 18 is also formed entirely in the plane directions without being separated. For this reason, it is desirable that the insulating layer 18 also be made of a resin material having a higher flexibility than that of the semiconductor layers 15 and being softer than inorganic substances. The insulating layer 18 is subjected to the patterning for forming the multiple minute openings 18a and 18b. For this reason, it is desirable for the insulating layer 18 to be made of a resin, such as polyimide for example, that is excellent in patterning of minute openings. On the other hand, it is desirable for the resin layer 25 to be made of a resin capable of being formed with a large thickness at low costs and also suitable for achieving the reinforcement function. In addition, it is also desirable for the resin layer 25 to be made of a material having a coefficient of thermal expansion equal or close to that of the mount board 81.

Moreover, in order to enhance the function of the resin layer 25 as a reinforcement material, it is effective to mix the resin layer 25 with a solid powder such as silica for example. In this case, however, the resin layer 25 may possibly become stiff and difficult to bend.

Figure 10:
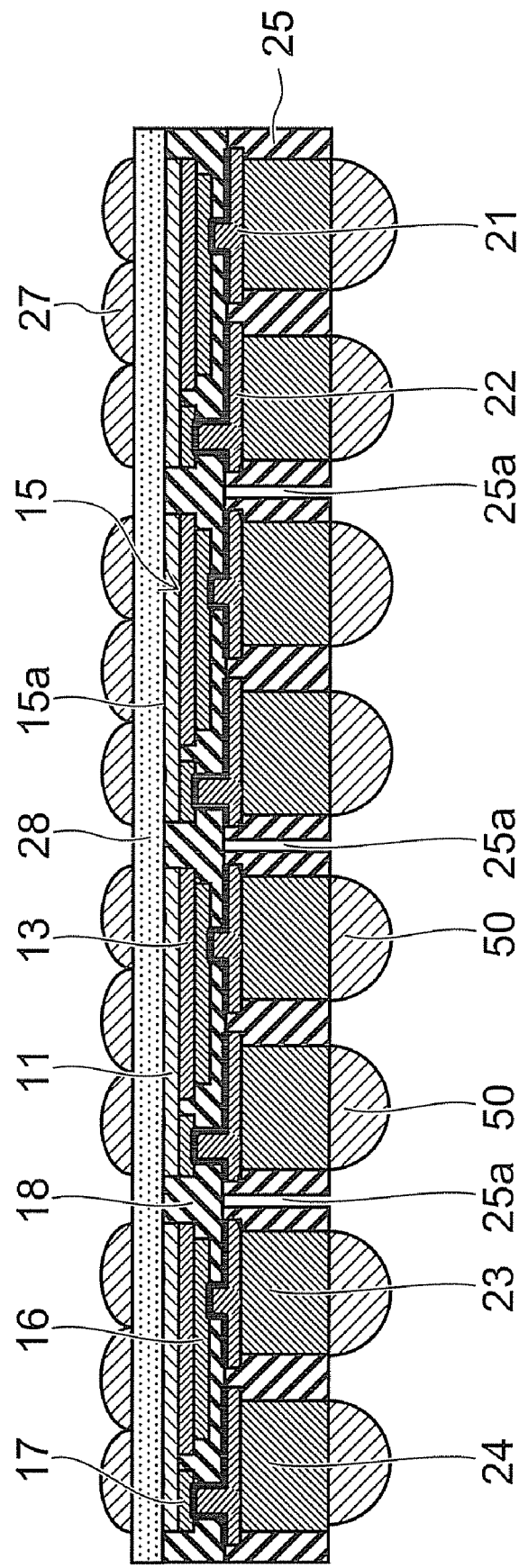
FIG. 10 is a schematic cross-sectional view of a semiconductor light emitting device of another embodiment.

In this regard, as shown in FIG. 10, the resin layer 25 can be made more bendable by forming slits 25a in the resin layer 25. The slits 25a are formed to extend in the thickness direction of the resin layer 25. Since the semiconductor light emitting device 9 is bent at portions where the multiple semiconductor layers 15 are not connected, it is effective to form the slits 25a under portions each between adjacent ones of the multiple semiconductor layers 15.

The slits 25a may be formed to extend to the inside of the insulating layer 18 from the resin layer 25 side. Alternatively, slits may be formed to extend to the inside of the insulating layer 18 from the phosphor layer 28 side. The number, the depth, and the like, of the slits are determined in consideration of achieving a good balance between the bendability and the mechanical strength of the semiconductor light emitting device 9.

The thickness of each of the n-side metal pillars 24 and the p-side metal pillars 23 (the thickness thereof in the vertical direction in FIG. 1) is thicker than the thickness of a stacked body including the semiconductor layers 15, the n-side electrodes 17, the p-side electrodes 16, and the insulating layer 18. The aspect ratio (the ratio of the thickness to the plane size) of each of the metal pillars 23 and 24 is not limited to not less than 1, but the aspect ratio may be lower than 1. To put it differently, the thickness of each of the metal pillars 23 and 24 may be smaller than the plane size thereof.

According to the structure of the embodiment, even when the semiconductor layers 15 are thin, the n-side metal pillars 24, the p-side metal pillars 23, and the resin layer 25 are thickened to make it possible to maintain the mechanical strength. Moreover, the n-side metal pillars 24 and the p-side metal pillars 23 absorb and mitigate the stress that is applied to the semiconductor layers 15 through the external terminals 50 when the semiconductor light emitting device 9 is mounted on the mount board 81. It should be noted that the external terminals 50 for the connection of the semiconductor light emitting device 9 with the mount board 81 are not limited to solder but may be made of another metal.

Next, a method of manufacturing the semiconductor light emitting device of the embodiment will be described with reference to FIGS. 2A to 9B.

First, the first semiconductor layers 11 are formed on a main surface of a substrate 10, and then, second semiconductor layers 13 including light emitting layers 12 are formed on the first semiconductor layer 11. When these semiconductor layers, which are processed into the semiconductor layers 15, are of nitride semiconductors, the semiconductor layers 15 may be crystalline-grown on a sapphire substrate, for example.

Next, as shown in FIGS. 2A and 2B, which is a bottom view of FIG. 2A, separating trenches 14 piercing through the semiconductor layer 15 and reaching the substrate 10 are formed, for example, by the reactive ion etching (RIE) method using an unillustrated resist. The separating trenches 14 are formed, in a grid form for example, on the substrate 10 in a wafer form, and separate the multiple semiconductor layers 15 from one another.

Moreover, part of each second semiconductor layer 13 including the light emitting layer 12 is removed, for example, by the RIE method using an unillustrated resist, so that part of the first semiconductor layer 11 is exposed to the outside. In this way, an upper step portion, which is located relatively at an upper level when viewed from the substrate 10, and a lower step portion, which is located relatively at a lower level when viewed from the substrate 10, are formed on the second main surface side of each semiconductor layer 15. Each of the upper step portions includes the light emitting layer 12 while each of the lower step portions does not include the light emitting layer 12.

Then, a p-side electrode 16 and an n-side electrode 17 are formed respectively on a surface of each upper step portion (a surface of the second semiconductor layer 13) and a surface of each lower step portion (a surface of the first semiconductor layer 11). It does not matter whether the p-side electrodes 16 or the n-side electrodes 17 are formed first. Otherwise, the p-side electrodes 16 and the n-side electrodes 17 may be simultaneously formed of the same material.

Next, all the exposed part on the substrate 10 is covered with an insulating layer 18. Thereafter, as shown in FIG. 3A, the insulating layer 18 is patterned, for example, by wet etching, so that first openings 18a and second openings 18b are formed selectively in the insulating layer 18. The first openings 18a reach the p-side electrodes 16, and the second openings 18b reach the n-side electrodes 17. The separating trenches 14 are filled with the insulating layer 18.

Figure 4A:
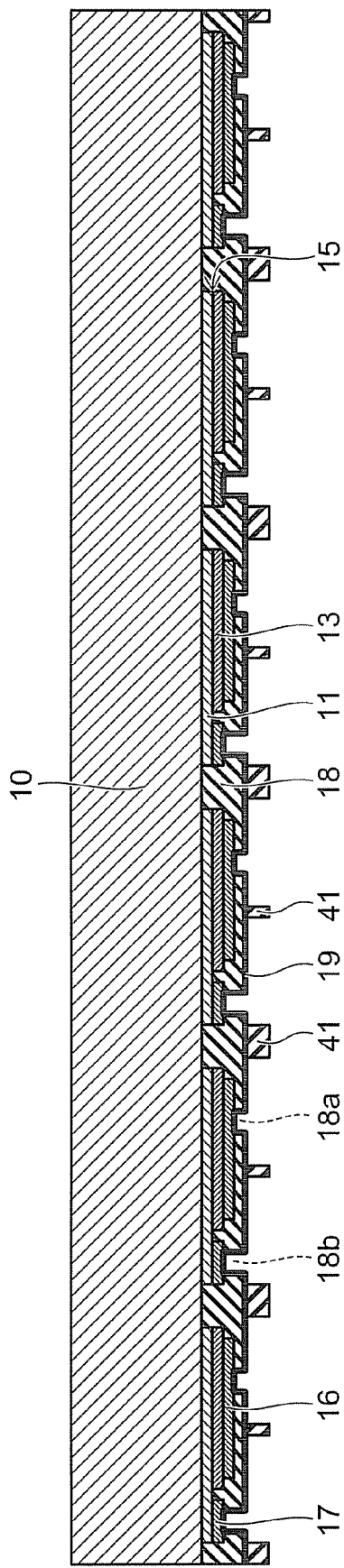

Next, as shown in FIG. 3B, a continuous seed metal 19 is formed on a surface of the insulating layer 18 as well as on inner surfaces of the first openings 18a and the second openings 18b. Further, as shown in FIG. 4A, a resist 41 is formed selectively on the seed metal 19, and Cu electroplating using the seed metal 19 as a current path is performed thereon.

Figure 4B:
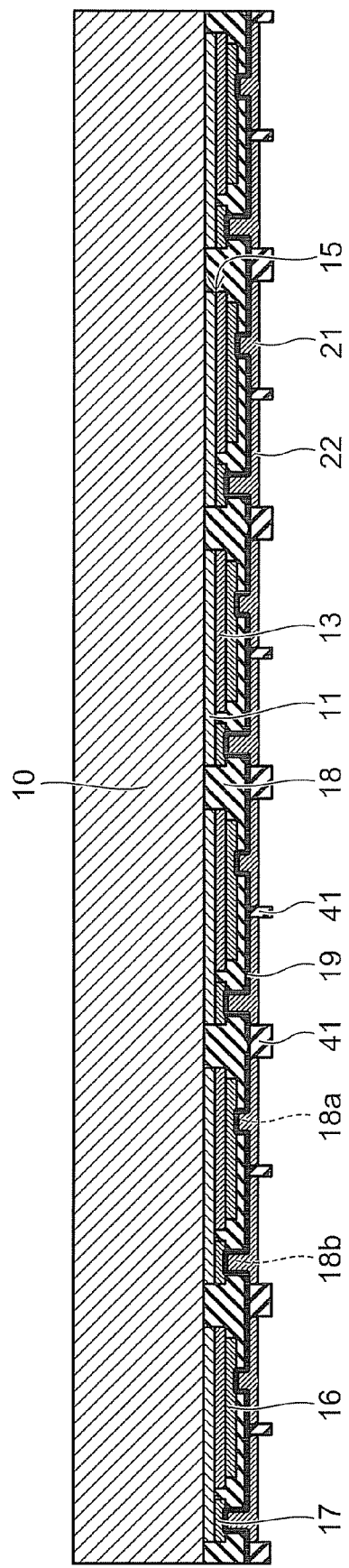

By the Cu electroplating, a p-side interconnection layer 21 and an n-side interconnection layer 22 are formed selectively on the seed metal 19, as shown in FIG. 4B. The p-side interconnection layer 21 and the n-side interconnection layer 22 are made of a copper material concurrently formed by the plating. The p-side interconnection layer 21 is formed also inside the first openings 18a, and thus is connected to the p-side electrodes 16 through the seed metal 19. The n-side interconnection layer 22 is formed also inside the second openings 18b, and thus is connected to the n-side electrodes 17 through the seed metal 19.

Figure 5A:
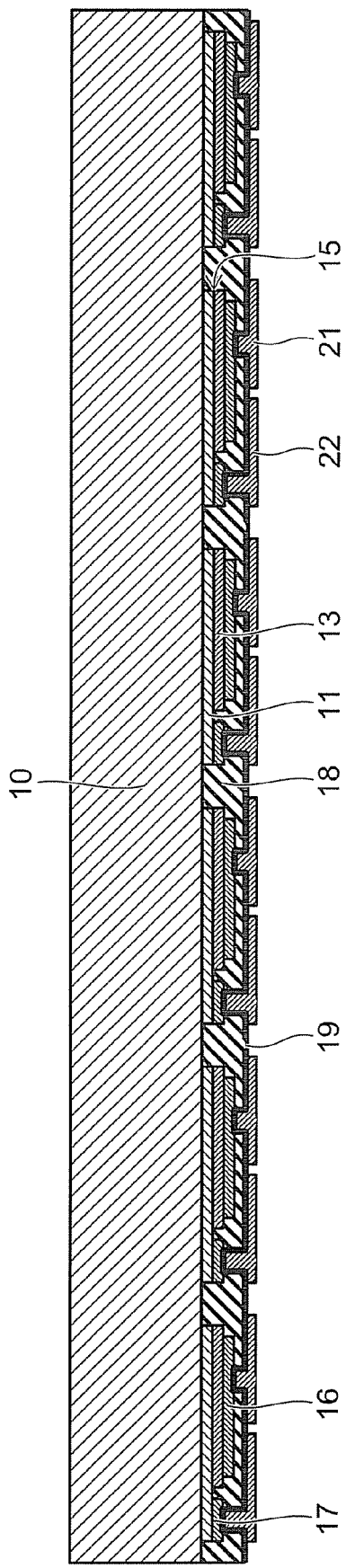
Figure 5B:
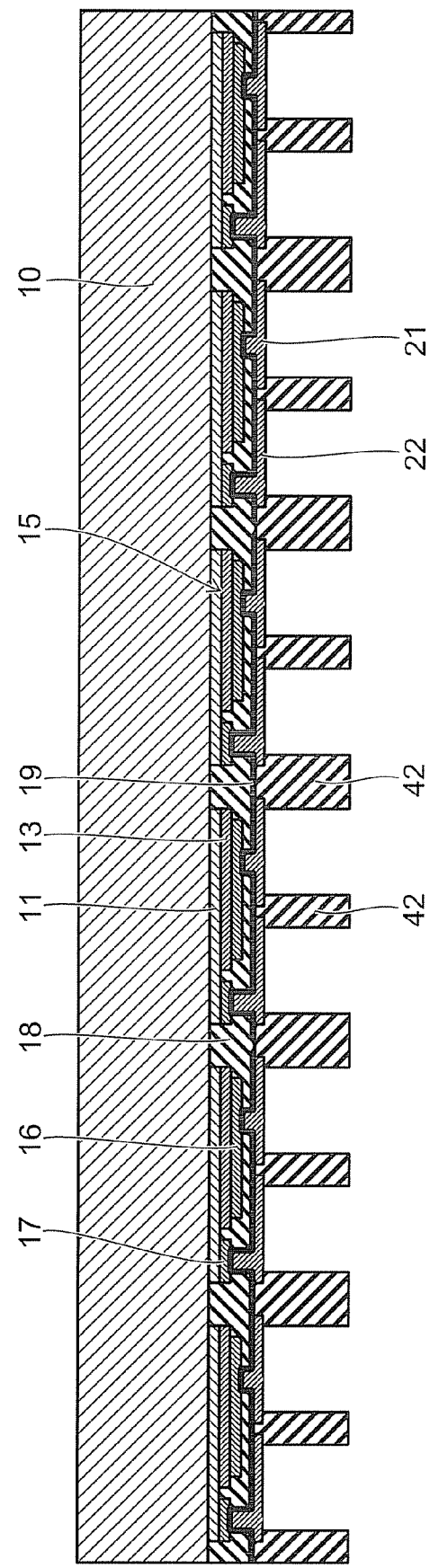

The resist 41 used for the plating of the p-side interconnection layer 21 and the n-side interconnection layer 22 is removed by using a chemical solution, for example (see FIG. 5A). After that, as shown in FIG. 5B, another resist 42 for forming metal pillars is formed, and Cu electroplating using the seed metal 19 as a current path is performed thereon. The resist 42 is thicker than the resist 41.

By the Cu electroplating, p-side metal pillars 23 are formed on a surface of the p-side interconnection layer 21 while n-side metal pillars 24 are formed on a surface of the n-side interconnection layer 22, as shown in FIG. 6A. The p-side metal pillars 23 and the n-side metal pillars 24 are made of a copper material concurrently formed by the plating.

As shown in FIG. 6B, the resist 42 is removed by using a chemical solution, for example. After that, exposed portions of the seed metal 19 are wet-etched using the p-side metal pillars 23 and the n-side metal pillars 24 as a mask. By the wet etching, the electrical connection between the p-side interconnection layer 21 and the n-side interconnection layer 22 through the seed metal 19 is disconnected.

Next, as shown in FIG. 7A, a resin layer 25 is stacked on the insulating layer 18. The resin layer 25 is filled between the p-side interconnection layer 21 and the n-side interconnection layer 22 as well as between the p-side metal pillars 23 and the n-side metal pillars 24. A side surface of each of the p-side metal pillars 23 and a side surface of each of the n-side metal pillars 24 are covered by the resin layer 25. A back surface of the resin layer 25 is ground, so that a lower surface of each of the p-side metal pillars 23 and a lower surface of each of the n-side metal pillars 24 are exposed to the outside.

Thereafter, as shown in FIG. 7B, the substrate 10 is removed. The substrate 10 is removed, for example, by a laser lift-off method. To be specific, a laser beam is applied toward the first semiconductor layer 11 from the back surface side of the substrate 10. The laser beam is capable of being transmitted through the substrate 10, but has a wavelength which causes the first semiconductor layer 11 to be an absorption region.

When the laser beam reaches a boundary between the substrate 10 and the first semiconductor layer 11, the first semiconductor layer 11, near the boundary, absorbs the energy of the laser beam, and is thus decomposed. For example, when the first semiconductor layer 11 is made of GaN, the first semiconductor layer 11 is decomposed into Ga and a nitride gas. The decomposing reaction generates a minute gap between the substrate 10 and the first semiconductor layer 11, so that the substrate 10 and the first semiconductor layer 11 are separated from each other.

The application of the laser beam is performed for multiple times respectively on set regions over the entire wafer, so that the substrate 10 is removed. The removal of the substrate 10 from the first main surface 15a enhances the light extraction efficiency.

The surface from which the substrate 10 is removed is cleaned, and further, the surface is roughened by a frosting process. The roughening of the first main surface 15a enhances the light extraction efficiency.

Here, the layer made of the resin and the metal is flexible, and the metal is formed by plating at near room temperature. Hence, the residual stress occurring with respect to the translucent substrate 10 is relatively low.

In the conventional technique for separating the semiconductor layer from the translucent substrate at wafer level, for example, it is bonded to a silicon substrate with a metal layer formed thereon using Au—Sn solder at a high temperature of 300° C. or more, and then the semiconductor layer made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residua stress is locally relieved from the separated portion and unfortunately causes cracks in the thin, brittle semiconductor layer.

In contrast, in this embodiment, the residual stress is low, and the semiconductor layer 15 is separated in the state of being fixed to a flexible support. Hence, the device can be manufactured at high yield without trouble such as cracking in the semiconductor layer 15.

Thereafter, as shown in FIG. 8A, a phosphor layer 28 is formed on the first main surface 15a and on the insulating layer 18 between adjacent ones of the semiconductor layers 15. For example, the phosphor layer 28 is formed by applying a liquid transparent resin having phosphor particles dispersed therein by a spin-coating method, and thereafter thermosetting the liquid transparent resin thus applied. Moreover, as shown in FIG. 8B, lenses 27 are formed on the phosphor layer 28.

Thereafter, dicing is performed at positions of the separating trenches 14 (see FIGS. 2A and 213), to obtain multiple separated semiconductor light emitting devices 9 (see FIG. 9A). At the dicing, the substrate 10 has already been removed. Moreover, the semiconductor layers 15 do not exist in the separating trenches 14, and accordingly, the filling of a resin as the insulating layer 18 in the separating trenches 14 facilitates the dicing, in turn, enhancing the productivity. Furthermore, the semiconductor layers 15 can be prevented from being damaged at the time of dicing. In addition, after the dicing process, a structure in which end portions (side surfaces) of each of the semiconductor layers 15 are covered and protected with the resin can be obtained. Each of the semiconductor light emitting devices 9 thus separated has a multi-chip structure including the multiple semiconductor layers 15.

The above-described processes before the dicing are performed collectively in the form of wafer. For this reason, there is no need to perform interconnection and packaging for each of individual separated devices. Therefore, it is made possible to reduce the production costs to a large extent. In other words, the interconnection and packaging have already been completed when the separation is done. In addition, inspection is made possible at the wafer level, which enhances the productivity. As a result, a reduction in product prices can be facilitated.

Each separated semiconductor light emitting device 9 is mounted on the mount board 81 with external terminals 50 interposed therebetween, as shown in FIG. 9B. Suppose a case where solder is used as the external terminals 50, for example. In this case, after solder is provided onto pads 82 formed on the mount board 81 or after solder is provided on lower surfaces of the p-side metal pillars 23 and the n-side metal pillars 24 in the semiconductor light emitting device 9, the semiconductor light emitting device 9 is mounted on the mount board 81 with the solder therebetween. Then, the solder is melted, so that the p-side metal pillars 23 and the n-side metal pillars 24 are soldered to the respective pads 82.

When the mount board 81 is a flexible board, the semiconductor light emitting device 9 may be first mounted on the flexible board, and then, bent together with the flexible board, so that the semiconductor light emitting device 9 mounted on a curved surface can be obtained, as shown in FIG. 1. Alternatively, the semiconductor light emitting device 9 may be mounted, while being concurrently bent, on a mount board which has already been curved.

Figure 11:
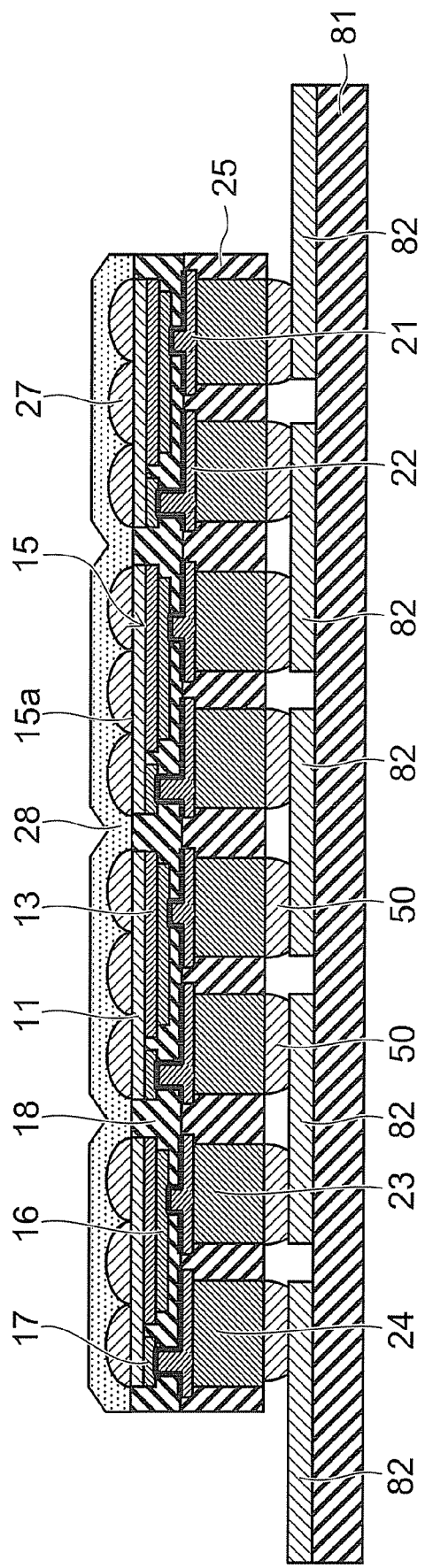
FIG. 11 is a schematic cross-sectional view of a semiconductor light emitting device of still another embodiment.

It should be noted that, as shown in FIG. 11, the phosphor layer 28 may be formed in such a manner as to cover the lenses 27 after the lenses 27 are formed on the first main surface 15a. In addition, the lenses are not limited to convex lenses but may be concave lenses.

As the phosphor layer 28, a red phosphor layer, a yellow phosphor layer, a green phosphor layer, or a blue phosphor layer described below as examples may be used.

The red phosphor layer may contain a nitride phosphor CaAlSiN$_3$:Eu, or a SiAlON phosphor, for example.

When the SiAlON phosphor is used, one represented by the following Compositional Formula (1) is preferably used:

$$(M_{1-x}R_x)_{a1}AlSi_{b1}O_{c1}N_{d1} \quad \text{Compositional Formula (1)},$$

where M is at least one of metal elements exclusive of Si and Al, and desirable for M is at least one of Ca and Sr; R is a luminescent center element, and desirable for R is Eu; and x, a1, b1, c1, and d1 satisfy the following relationships: $0<x\leq1$; $0.6<a1<0.95$; $2<b1<3.9$; $0.25<c1<0.45$; and $4<d1<5.7$.

Using the SiAlON phosphor represented by Compositional Formula (1) improves the temperature characteristics of the wavelength conversion efficiency, and therefore, makes it possible to further improve the efficiency in a large current density region.

The yellow phosphor layer may contain a silicate phosphor (Sr, Ca, Ba)$_2$SiO$_4$:Eu, for example.

The green phosphor layer may contain a halo phosphoric acid phosphor (Ba, Ca, Mg)$_{10}$(PO$_4$)$_6$.Cl$_2$:Eu, or a SiAlON phosphor, for example.

When the SiAlON phosphor is used, one represented by the following Compositional Formula (2) is preferably used:

$$(M_{1-x}R_x)_{a2}AlSi_{b2}O_{c2}N_{d2} \quad \text{Compositional Formula (2)},$$

where M is at least one of metal elements exclusive of Si and Al, and desirable for M is at least one of Ca and Sr; R is a luminescent center element, and desirable for R is Eu; and x, a2, b2, c2, and d2 satisfy the following relationships: $0<x\leq1$; $0.93<a2<1.3$; $4.0<b2<5.8$; $0.6<c2<1$; and $6<d2<11$.

Using the SiAlON phosphor represented by Compositional Formula (2) improves the temperature characteristics of the wavelength conversion efficiency, and therefore, makes it possible to further improve the efficiency in a large current density region.

The blue phosphor layer may contain an oxide phosphor BaMgAl$_{10}$O$_{17}$:Eu, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light emitting device comprising:
   a plurality of semiconductor layers including a first main surface, a second main surface opposite to the first main surface, and a light emitting layer, the plurality of semiconductor layers being separated from one another;
   a first electrode provided on the second main surface in a region including the light emitting layer;
   a second electrode provided on the second main surface in a region not including the light emitting layer;
   an insulating layer provided on the second main surface side of the semiconductor layers and having a first opening and a second opening, the first opening reaching the first electrode, the second opening reaching the second electrode;
   a first interconnection layer provided on a surface of the insulating layer on an opposite side to the semiconductor layer and provided in the first opening, the first interconnection layer being connected to the first electrode;
   a second interconnection layer provided on the surface of the insulating layer on the opposite side to the semiconductor layer and provided in the second opening, the second interconnection layer being connected to the second electrode;
   a first metal pillar provided on a surface of the first interconnection layer on an opposite side to the first electrode;
   a second metal pillar provided on the surface of the second interconnection layer on the opposite side to the second electrode; and
   a resin layer provided between the first metal pillar and the second metal pillar,
   a material having a higher flexibility than the semiconductor layers being provided between the plurality of the semiconductor layers separated from one another, and
   the semiconductor light emitting device being mounted in a bent state on a curved surface.

2. The device of claim 1, wherein the insulating layer is filled between the plurality of semiconductor layers.

3. The device of claim 1, wherein the insulating layer is made of a resin material different from a material of the resin layer.

4. The device of claim 1, wherein the first electrode has a larger area than the second electrode.

5. The device of claim 1, wherein a contact area between the second interconnection layer and the second metal pillar is larger than a contact area between the second interconnection layer and the second electrode.

6. The device of claim 1, wherein part of the second interconnection layer extends on the insulating layer to a position facing the light emitting layer.

7. The device of claim 1, wherein
a slit is provided in the resin layer at a position under a portion between the plurality of semiconductor layers.

8. The device of claim 1, wherein the second electrode is provided outside an outer periphery of the light emitting layer on the second main surface.

9. A semiconductor light emitting device comprising:
a plurality of semiconductor layers including a first main surface, a second main surface opposite to the first main surface, and a light emitting layer, the plurality of semiconductor layers being separated from one another;
a first electrode provided on the second main surface in a region including the light emitting layer;
a second electrode provided on the second main surface in a region not including the light emitting layer;
an insulating layer provided on the second main surface side of the semiconductor layers, provided between the plurality of semiconductor layers separated from one another and having a first opening and a second opening, the first opening reaching the first electrode, the second opening reaching the second electrode;
a first interconnection layer provided on a surface of the insulating layer on an opposite side to the semiconductor layer and provided in the first opening, the first interconnection layer being connected to the first electrode;
a second interconnection layer provided on the surface of the insulating layer on the opposite side to the semiconductor layer and provided in the second opening, the second interconnection layer being connected to the second electrode;
a first metal pillar provided on a surface of the first interconnection layer on an opposite side to the first electrode;
a second metal pillar provided on the surface of the second interconnection layer on the opposite side to the second electrode;
a resin layer provided between the first metal pillar and the second metal pillar, the resin layer having a higher flexibility than the semiconductor layers.

10. The device of claim 9, wherein a slit is formed in the resin layer in a thickness direction.

11. The device of claim 10, wherein the slit is formed at a position facing a portion between the plurality of semiconductor layers.

12. The device of claim 10, wherein the resin layer contains a solid powder.

13. The device of claim 9, wherein the resin layer contains a rubber as a main component.

14. The device of claim 9, wherein the insulating layer is filled between the plurality of semiconductor layers.

15. The device of claim 9, wherein the insulating layer is made of a resin material different from a material of the resin layer.

16. The device of claim 9, wherein the first electrode has a larger area than the second electrode.

17. The device of claim 9, wherein a contact area between the second interconnection layer and the second metal pillar is larger than a contact area between the second interconnection layer and the second electrode.

18. The device of claim 9, wherein part of the second interconnection layer extends on the insulating layer to a position facing the light emitting layer.

19. The device of claim 9, wherein the semiconductor light emitting device is mounted in a bent state on a curved surface.

20. The device of claim 9, wherein the second electrode is provided outside an outer periphery of the light emitting layer on the second main surface.

* * * * *